United States Patent
Oknaian et al.

(10) Patent No.: US 6,381,159 B2
(45) Date of Patent: Apr. 30, 2002

(54) INDUCTOR CURRENT SYNTHESIZER FOR SWITCHING POWER SUPPLIES

(75) Inventors: V. Stepan Oknaian, Van Nuys; J. Steven Brown, San Pedro, both of CA (US)

(73) Assignee: International Rectifier Corp., El Segundo, CA (US)

(*) Notice: Subject to any disclaimer, the term of this patent is extended or adjusted under 35 U.S.C. 154(b) by 0 days.

(21) Appl. No.: 09/814,237

(22) Filed: Mar. 21, 2001

Related U.S. Application Data

(60) Provisional application No. 60/209,478, filed on Jun. 5, 2000, and provisional application No. 60/190,926, filed on Mar. 21, 2000.

(51) Int. Cl.[7] .............................. H02M 3/24; G05F 1/40
(52) U.S. Cl. ........................... 363/98; 363/89; 323/282
(58) Field of Search ............................... 363/98, 97, 21, 363/89, 125, 132, 127; 323/282, 284, 285

(56) References Cited

U.S. PATENT DOCUMENTS

| | | | | |
|---|---|---|---|---|
| 4,974,141 A | * | 11/1990 | Severinsky et al. | 363/81 |
| 5,457,624 A | * | 10/1995 | Hasting | 363/127 |
| 5,773,966 A | | 6/1998 | Steigerwald | 323/284 |
| 5,847,554 A | | 12/1998 | Wilcox et al. | 323/282 |
| 6,160,388 A | * | 12/2000 | Skelton et al. | 323/282 |
| 6,166,528 A | | 12/2000 | Rossetti et al. | 323/283 |
| 6,246,220 B1 | * | 6/2001 | Isham et al. | 323/224 |

* cited by examiner

*Primary Examiner*—Rajnikant B. Patel
(74) *Attorney, Agent, or Firm*—Ostrolenk, Faber, Gerb & Soffen, LLP

(57) ABSTRACT

A circuit and method for sensing the inductor current flowing to a load from a switching power supply without using a sense resistor in the path of the inductor current. In a synchronous buck converter topology, the inductor current is derived by sensing the voltage drop across the synchronous MOSFET of the half-bridge and reconstructing the current using a sample and hold technique. A ripple current synthesizer is employed to reconstruct inductor current outside the sample and hold window. The sampled product $I_{Load} \times R_{DSon}$ is used to update the ripple current estimator with dc information every switching cycle. The resulting voltage waveform is directly proportional to the inductor current. The inductor current synthesizer of the present invention can also be used in boost converter, flyback converter and forward converter topologies.

19 Claims, 5 Drawing Sheets

INDUCTOR CURRENT SYNTHESIZER FOR SWITCHING POWER SUPPLIES

This application claims the benefit of U.S. Provisional Application Serial No. 60/190,926, filed Mar. 21, 2000, and U.S. Provisional Application Serial No. 60/209,478, filed Jun. 5, 2000.

BACKGROUND OF THE INVENTION

1. Field of Invention

The present invention relates to current mode control of switching power supplies, particularly low voltage power supplies.

2. Description of Related Art

Current mode power supplies, such as the synchronous buck converter shown in FIG. 1, typically use a resistive element to sense current. This method has the drawback of causing additional circuit losses, and the sense resistor occupies space. Accordingly, it would be desirable to provide a current mode power supply which does not require a resistive element for sensing inductor current.

SUMMARY OF THE INVENTION

The present invention, in lieu of directly sensing the inductor current with a resistor, derives the inductor current by sensing the voltage drop across the synchronous MOSFET of the half-bridge and reconstructs the current using a sample and hold technique. A ripple current synthesizer is employed to reconstruct inductor current outside the sample and hold window. The sampled product $I_{Load} \times R_{DSon}$ is used to update the ripple current synthesizer with dc information every switching cycle. The resulting voltage waveform is directly proportional to the inductor current.

The power converter may operate at constant switching frequency if desired. The synchronous MOSFET may be turned off after a brief sample period if desired. The inductor current synthesizer of the present invention can be used not only in a synchronous buck converter power supply, but also with boost converter, flyback converter and forward converter topologies.

Other features and advantages of the present invention will become apparent from the following description of the invention, which refers to the accompanying drawings.

DETAILED DESCRIPTION OF PREFERRED EMBODIMENTS

Figure 1:
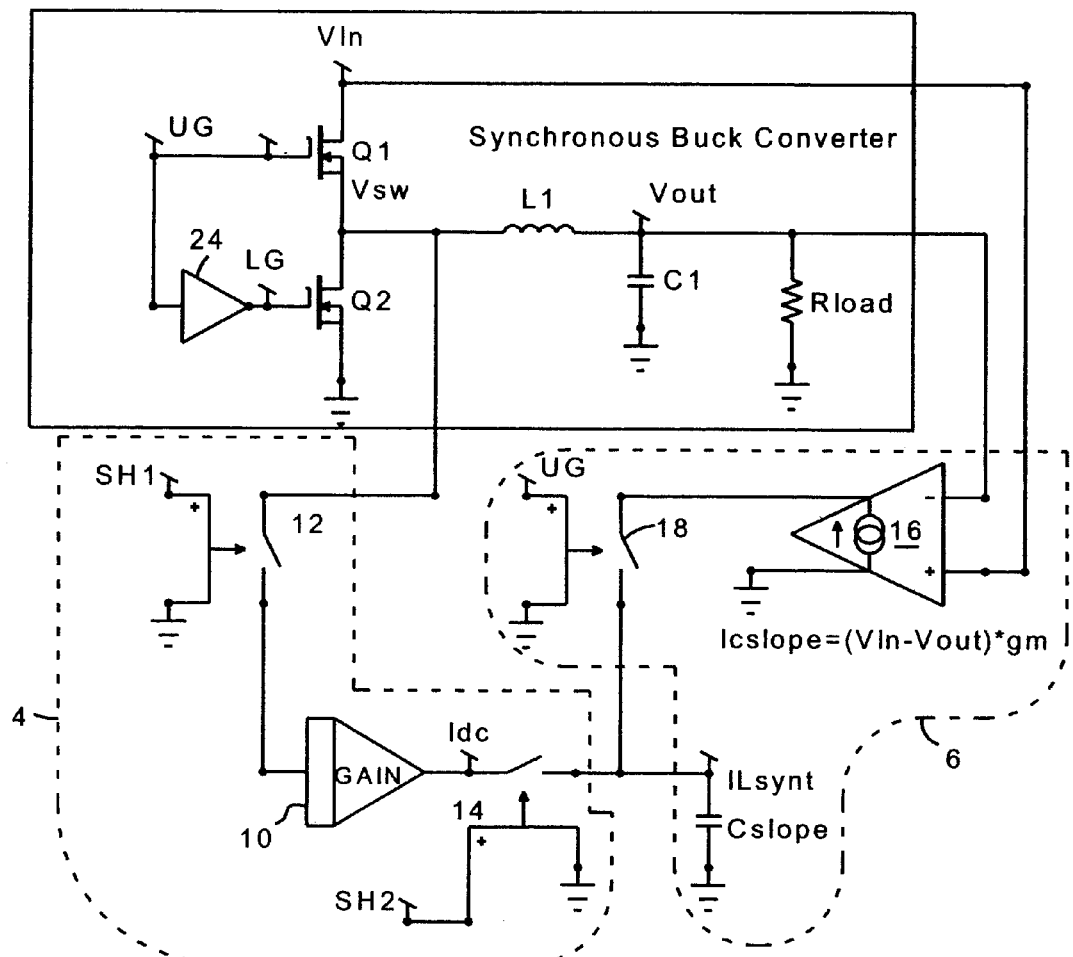
FIG. 1 shows a circuit schematic of the inductor current synthesizer circuit of the present invention.

Referring to FIG. 1, the inductor current synthesizer circuit of the present invention is identified generally by reference numeral 2 and comprises two major circuit blocks, namely a switching power supply dc load information converter 4, and an inductor ripple current estimator 6.

Switching power supply dc load information converter 4 comprises inverting amplifier 10 and sample and hold switches 12 and 14. Inductor ripple current estimator 6 comprises transconductance amplifier 16, current slope synthesizer $C_{slope}$, and control switch 18.

Figure 4A:
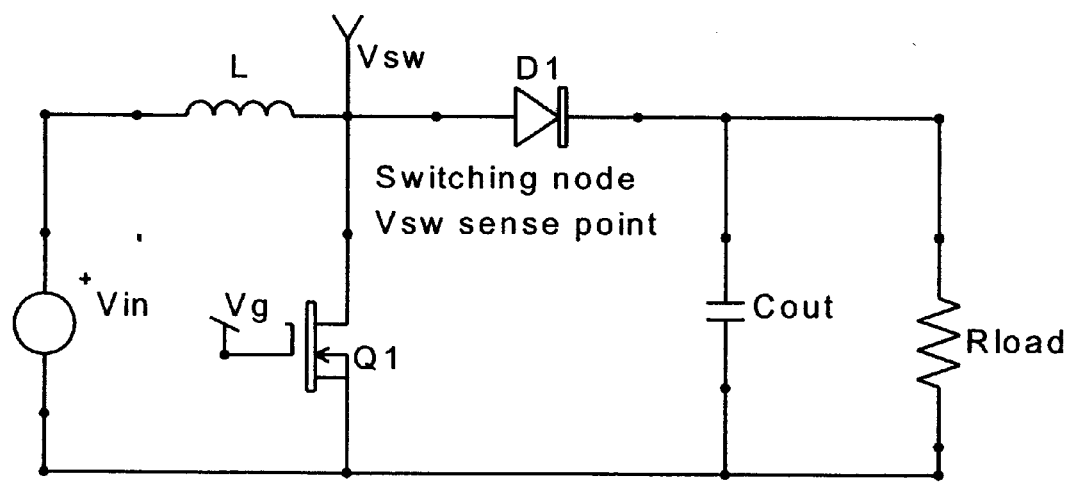
FIGS. 4a, 4b and 4c show common power circuit topologies in which the inductor current synthesizer of the present invention can employed.
Figure 4B:
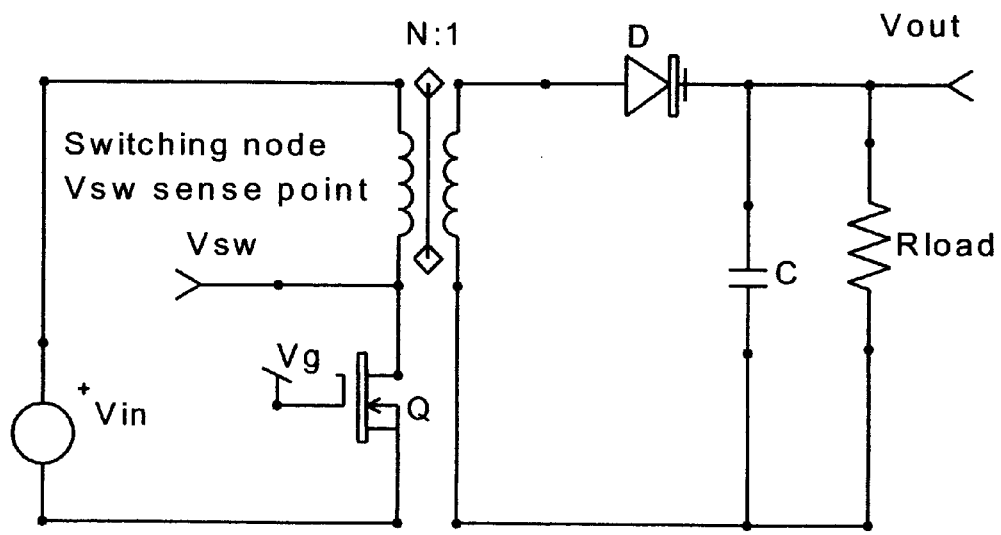
Figure 4C:
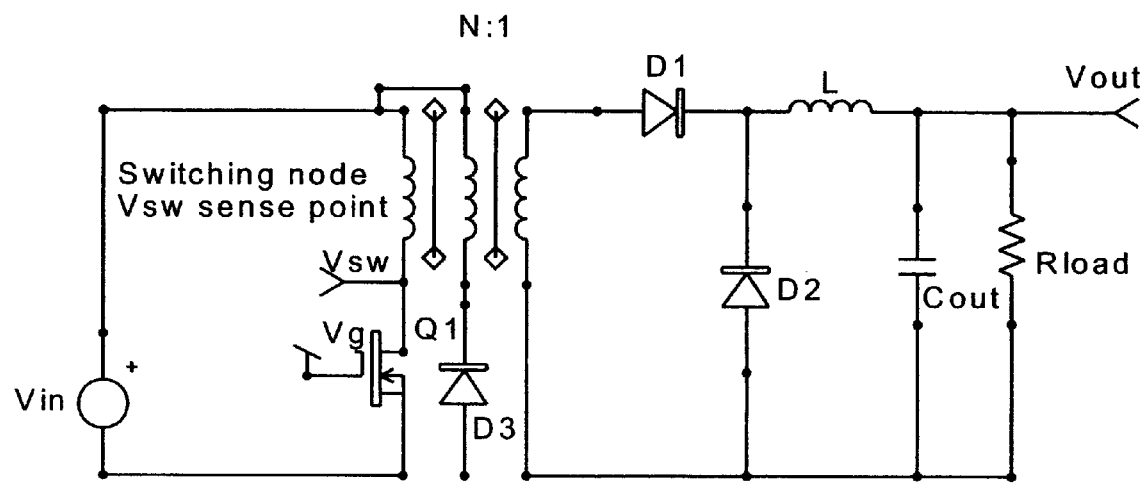

The synchronous buck power stage in FIG. 1, which consists of power MOSFETs Q1 and Q2, MOSFET driver 24, inductor L1, output capacitor C1 and $R_{load}$, is used to illustrate the operation of the current synthesizer circuit of the present invention. As shown in FIGS. 4a–4c, the current synthesizer circuit of the present invention can also be used in boost converter, flyback converter and forward converter topologies.

In a conventional buck converter as shown in FIG. 1, a high drive pulse at UG (upper gate driver) turns MOSFET Q1 on and a high drive pulse at LG (lower gate driver) turns MOSFET Q2 on. Drive pulses UG and LG are complementary as shown in FIG. 2, waveforms 2 and 3.

Figure 2:
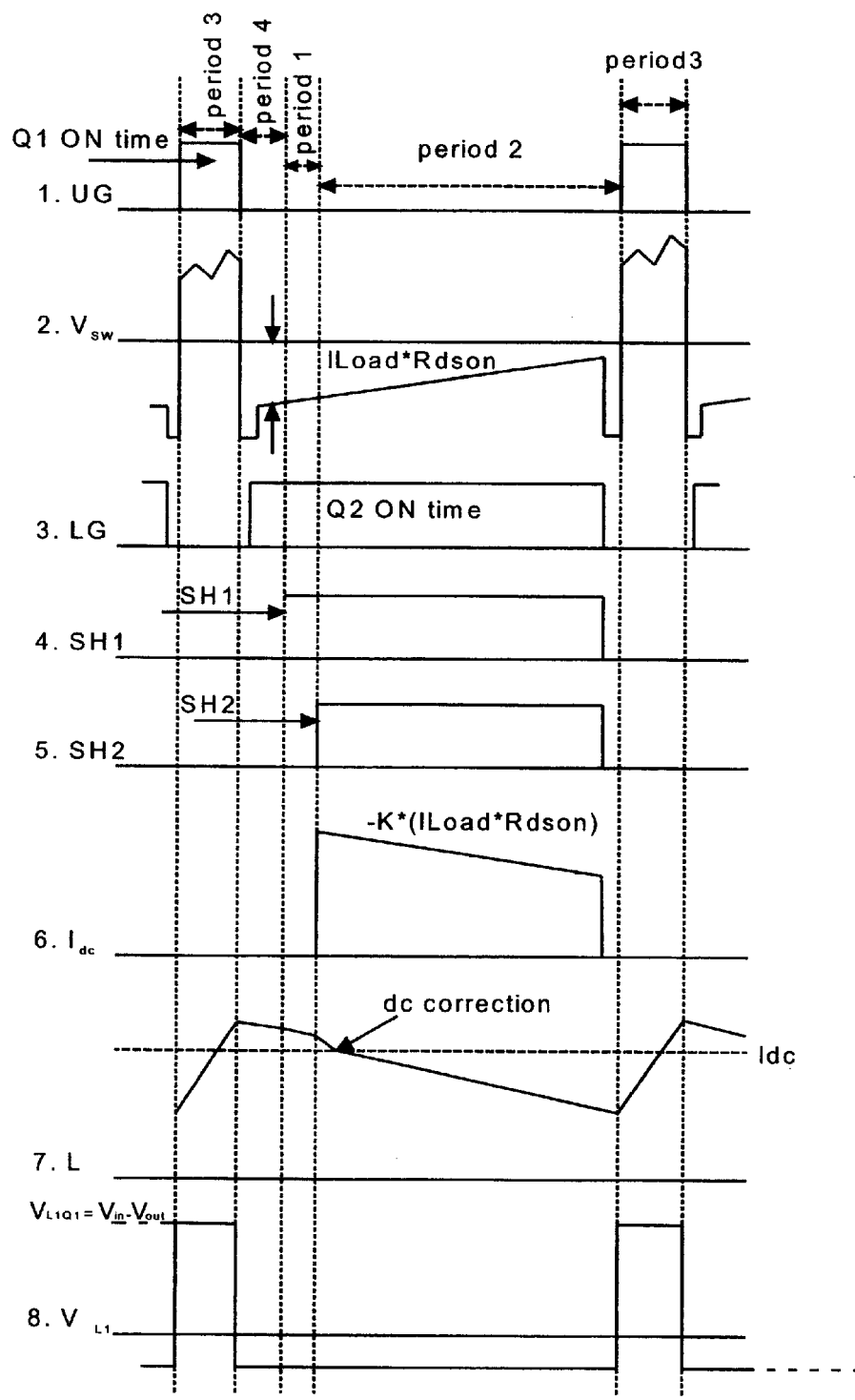
FIG. 2 shows a set of timing and control waveforms that illustrate the operation of the circuit the schematic of which is provided in FIG. 1.

Referring to FIG. 2, the operation of the inductor current synthesizer of the present invention is as follows:

PERIOD 1: Sample Period 1 (SH1)

Sample Period 1 (SH1), which is the settling time period for inverting amplifier 10, allows the transfer of switch node negative voltage $V_{sw}$ information expressed in equation (1) to inverting amplifier 10.

$$V_{sw} = -(I_{Load}) \times (R_{dsonQ2}) \tag{1}$$

Sample period SH1 is adequate to allow inverting amplifier output 10 to settle before Sample Period 2. Inverting amplifier 10 amplifies the sampled portion of $V_{sw}$ by a factor required by current mode control system loop, and is denoted by Idc shown as waveform 6 in FIG. 2. The output Idc of inverting amplifier 10 is described by equation (2), where $-K_{10}$ is the gain of inverting amplifier 10.

$$I_{dc} = -K_{10} \times V_{sw} \tag{2}$$

PERIOD 2: Sample Period 2 (SH2)

After an appropriate delay from the application of SH1, Sample Period 2 is initiated through closure of switch 14 by the dc update signal SH2 as shown in waveform 5 of FIG. 2. The closure of switch 14 provides cycle-by-cycle update of dc information to $C_{slope}$.

ILsynth, shown in waveform 7 of FIG. 2, experiences a slight correction of ramp voltage, which is indicative of the ILsynth signal being calibrated to Idc level through closure of switch 14. In practice, the correction to ILsynth may be either positive, negative, or rarely, zero. The DC update signal SH2 is held high throughout the Q2 on time period.

Waveform 8 of FIG. 2 shows the inductor voltage $V_{L1}$ which can be calculated according to equation (3):

$$V_{L1Q2} = V_{out} + I_{L1} \times R_{dson} \tag{3}$$

PERIOD 3: Ripple Charge Period

As UG goes high, Q2 is turned off and Q1 is turned on and $V_{sw}$ approaches the input voltage and the inductor voltage becomes $V_{L1Q1}$ as expressed in equation (4) and as shown in waveform 8 of FIG. 2. The output of transconductance amplifier 16 provides a charging current to charge Cslope which can be derived from equations (4) through (9):

$$V_{L1Q1} = V_{in} - V_{out} \tag{4}$$

The inductor current ripple $di_{L1}$ is represented by equation (5)

$$di_{Li} = \frac{V_{L1Q1} \times dt_{on}}{L1} \tag{5}$$

The $i_{Cslope}$ capacitor charging current is related to the inductor voltage $V_{L1Q1}$ by the transconductance $G_{m16}$ of amplifier 16, and is represented by equation (6):

$$i_{Cslope} = G_{m16} \times V_{L1Q1} \quad (6)$$

The capacitor charge current $i_{Cslope}$ also develops a changing voltage dv which is represented by equation (7):

$$i_{Cslope} = C_{slope} \times \frac{dv_{slope}}{dt_{on}} \quad (7)$$

The change of inductor current $di_{L1}$ is related to change in capacitor voltage $dv_{Cslope}$ by scaling factor K and is represented in equation (8):

$$di_{L1} = K \times dv_{Cslope} \quad (8)$$

By proper substitution, a relationship between K factor and transconductance $G_{m16}$ is established and is represented by equation (9)

$$\frac{V_{L1Q1} \times dt_{on}}{L_1} \times K = \frac{V_{L1Q1} \times dt_{on}}{C_{slope}} \times G_{m16} \quad (9)$$

PERIOD 4: Switch Node settling period

The switch node settling period is the period when turn-off and recovery of Q1 take place and Q2 is in the turn-on process. It provides adequate switch node settling time before Period 1 is initiated.

Figure 3:
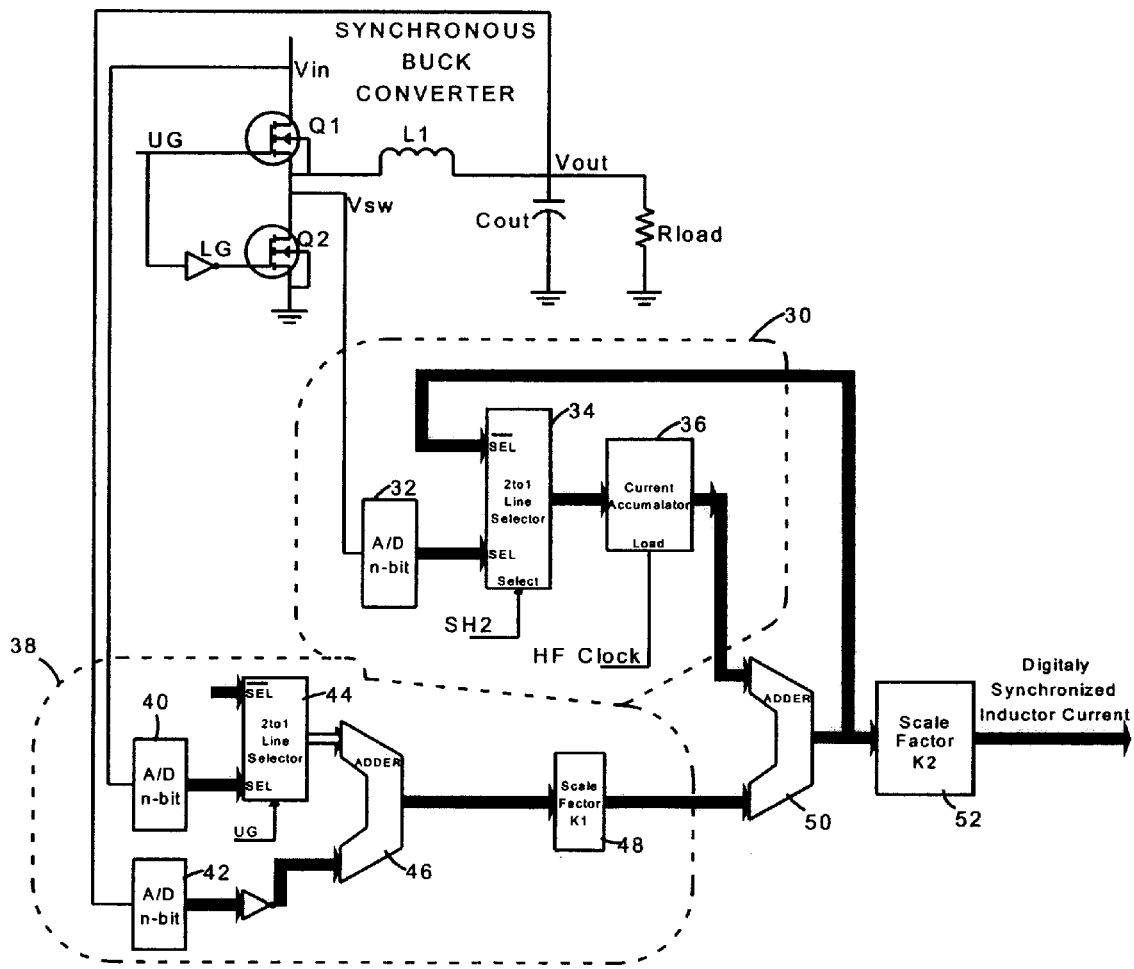
FIG. 3 shows a digital embodiment of the inductor current synthesizer of the present invention.

The inductor current synthesizer represented in FIG. 3 is the digital embodiment of the inductor current synthesizer circuit of the present invention.

Similar to the analog counterpart shown in FIG. 1, the digital embodiment consists of two major building blocks.
1. The switching power supply dc load and accumulated error information converter 30, which comprises n-bit analog to digital converter 32, two to one line selector 34, and current accumulator 36; and
2. Inductor ripple current estimator 38, which comprises n-bit analog to digital converters 40 and 42, two to one line selector 44, adder 46, and scaling stage 48.

Inputs from both stages are added at adder 50, and scaled in scaler 52, the output of which is the digitally synthesized inductor current.

The power stage is similar to the one described with respect to the first embodiment of the invention. It consists of Q1 and Q2 power MOSFETs, inductor L1, output capacitor C1 and load $R_{load}$.

As in a conventional buck converter, a high output UG turns Q1 on and a high output LG turns Q2 on. UG and LG are complementary drive pulses.

The states of the inductor current digital synthesizer are described in the following table:

|  | Sample Period SH1 | Sample Period SH2 | Ripple Discharge Period | Ripple Charge Period |
| --- | --- | --- | --- | --- |
| UG | Low | Low | Low | High |
| LG | High | High | High | Low |
| SH1 | High | High | Low | Low |
| SH2 | High, delayed wrt to SH1 | High | Low | Low |

The operation of the inductor current digital synthesizer is described in the following paragraphs:

In the following paragraphs, the notations used in the formulae are defined as:
Vout: Output voltage of the synchronous regulator, in volts
Vin: Input voltage of the synchronous regulator, in volts
Vsw: Switching node voltage of the synchronous regulator, in volts
$\Delta Count_{dis}$: Incremental count during discharge period, unitless
$\Delta Count_{ch}$: Incremental count during charge period, unitless
HF: Frequency of the high frequency clock in MHz
FS: Full scale voltage range, in volts
L1: inductance of L1 inductor, in henries
K1: scaling factor, unitless
K2: scaling factor, unitless
n: number of Analog to Digital converter bits Sample Period SH1

Sample period SH1 is the period when the output of A/D converter 32 is allowed to settle. This includes the period of quantization of the analog information and the binary coding of the quantized input.

During this period the time varying input switch node voltage Vsw(t) is digitized into n-bits by analog to digital converter 32.

$$Vsw_{(t)} \overset{nbits}{\rightarrow} Vsw_{(0)} \ldots Vsw_{(n)}$$

Sample Period SH2

During this period, the output of analog to digital converter 32 is used to recalibrate the synthesized inductor current information at current accumulator 36.

SH2 is a timed signal that enables the output of A/D converter 32 to be transferred to the output of selector 34 during the on time of Q2. Thus, the digitized current information is supplied to current accumulator 36 via selector 34 selector during SH2.

Ripple Discharge period

When Q2 is turned on, Logic Low inputs of selector 44 are selected. Therefore, the output of adder 46 is the complemented value of the output voltage.

The output of A/D converter 42, converted into n-bits, is:

$$Vout_{(t)} \overset{nbits}{\rightarrow} Vout_{(0)} \ldots Vout_{(n)}$$

and is complemented at inverter 45 because during this period the inductor voltage is −Vout.

The output of selector 44 steers the logic low inputs to adder 46.

During discharge, the incremental count $\Delta Count_{dis}$ at each clock cycle is calculated according to:

$$\Delta Count_{dis} = \frac{-Vout}{L_1} \times \frac{1}{HF} \quad (10)$$

Also, $$\Delta Count_{dis} = \frac{-Vout}{K_1} \times \frac{2^n - 1}{FS} \quad (11)$$

where K1 is the scaling factor which is calculated from equations (10) and (11):

$$K1 = \frac{2^n - 1}{FS} \times L_1 \times HF \quad (12)$$

The expression for K1 in equation (12) indicates that it is independent of the input and the output voltages and is modified due to errors caused by variations in inductance of the inductor, the high frequency clock, and number of A/D converter bits.

During this period, the selected data at the output of selector 34 is loaded to the current accumulator 36 at each occurrence of the high frequency clock HF. The accumulated data is fed to adder 50.

Ripple Charge Period

When Q1 is turned on, the quantized input voltage Vin at the output of n-bit A/D converter 40 is selected by two to one line selector 44. The output of selector 44 is provided to one of the inputs of adder 46. The data at the output of adder 46 is the digital representation of Vin−Vout.

The output of A/D converter 40 is Vin converted to n-bits:

$$Vin_{(t)} \xrightarrow{nbits} Vin_{(0)} \ldots Vin_{(n)}$$

The output of selector 44 steers the digitized Vin inputs to adder 46. During this period, the inductor voltage will be $V_{in}-V_{out}$.

During charge the incremental count at each clock cycle will be:

$$\Delta Count_{ch} = \frac{(Vin - Vout)}{L_1} \times \frac{1}{HF}$$

Through a similar exercise, one can demonstrate that the expression obtained for K1 in ripple charge period is identical to the one obtained in the ripple discharge period, which is independent of Vin and Vout.

The inductor current up-slope and down-slope information is fed to adder 50 after being scaled by scaler 48.

During this period, the selected data at the output of selector 34 is loaded to the current accumulator 36 at each occurrence of the high frequency clock HF. The accumulated data is fed to adder 50.

Scaling factor K2 at scaler 52 provides correction for changes for synchronous MOSFET Q2 Rdson process variations and Rdson temperature variations.

EXAMPLE

Assume A/D converter 32 is 10 bits. A/D converters 40 and 42 are 8 bits.

Switching frequency $f_s$: 300 KHz,
Switching period $T_s$: 3.33 microseconds.
Inductor $L_1$: 800 nH
HF Clock: 10 MHz,
Q2 on resistance $R_{dson}$: 6 millions
Input voltage $V_{in}$: 20 Volts
Output voltage $V_{out}$: 1.3 Volts
$I_{L1}$=20 A
Inductor ripple current: 5 A
n: 10 bits for A/D converter 32 and 8 bits for A/D converters 40 and 42 Input of A/D converter 32 when Q2 is conducting is:

$$V_{sw} = R_{dson} \times I_{L1} \quad (1)$$

$V_{sw}$=0.006*20 A=120 mV
Voltage to Current scaling is 100 mV/A
A/D converter 32 will output 120 counts at 1.024v Full Scale.

$$Count/Amp = \frac{120\,count}{20A} = 6\,counts/Amp$$

At the ripple generator, 25.5 volts Full Scale for an 8 bit A/D.

Number of counts to maintain 5 A peak to peak ripple:

$$C_{ripple} = 5A \times 6\,count/A = 30\,counts \quad (2)$$

Each clock cycle will provide $C_{clk}$ counts $$Count_{ch} = \frac{(V_{in} - V_{out})}{L_1} \times \frac{1}{HF} = 2.34 A/clk \quad (3)$$

Number of counts required to generate 5 A ripple
$C_{clk} = Count/A \times Count_{ch}$
$C_{clk} = 6 \times 2.34 = 14.04$ counts
K factor is calculated:

$$K1 = (V_{in} - V_{out}) \times \frac{255}{FS} \times \frac{1}{C_{clk}} \quad (4)$$

K1=13.32

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A current mode power supply, comprising:
   first and second transistors disposed in a half-bridge configuration between an input voltage and ground with a common terminal at a node between the first and second transistors, the first transistor being disposed between the input voltage and the node, the second transistor being disposed between the node and ground, the first and second transistors being alternately gated on and off by appropriate drive signals to generate a square wave voltage output which is filtered and supplied as an output voltage to provide a current to a load; and
   a load current synthesizer circuit for sampling the voltage across the second transistor and using the sampled voltage, together with the output voltage, to construct a voltage waveform representing the dc current level and the ripple current supplied to the load without a sense resistor in the path of the current.

2. A power supply for delivering current to a load, comprising:
   a transistor for switching a voltage for controlling the flow of current to be supplied to a load at an output voltage; and
   a load current synthesizer circuit for sampling the voltage across the transistor and using the sampled voltage, together with the output voltage, to construct a voltage waveform representing the dc current level and the ripple current supplied to the load without a sense resistor in the path of the load current.

3. The current mode power supply of claim 1, wherein the load current synthesizer circuit comprises:
   a dc load information converter connected to the node between the first and second transistors for sensing the voltage across the second transistor; and ripple current synthesizer connected to the input and output voltages for sensing the ripple current delivered to the load.

4. The current mode power supply of claim 3, wherein the dc load information converter comprises a first sample and hold circuit and an inverting amplifier with gain for sampling the voltage across the second transistor during a first sample period.

5. The current mode power supply of claim 4, wherein the dc load information converter further comprises a second sample and hold circuit and the ripple current synthesizer comprises a capacitor for holding a voltage corresponding to the ripple current supplied to the load, and wherein the capacitor is updated with the voltage across the second transistor by activating the second sample and hold circuit during a second sample period.

6. The current mode power supply of claim 5, wherein the ripple current synthesizer further comprises a transconductance amplifier and a control switch for discharging the capacitor during a second time period in accordance with the output voltage, and for charging the capacitor in accordance with the difference between the input voltage and the output voltage during a third time period when the second transistor is turned off and the first transistor is turned on.

7. The current mode power supply of claim 6, wherein a fourth time period is provided for the node to settle to allow turn-off and recovery of the first transistor and turn-on of the second transistor.

8. The current mode power supply of claim 3, further comprising a plurality of A/D converters for converting the voltage across the second transistor, the input voltage and the output voltage into digital format, and wherein the dc load information converter and the current ripple estimator are implemented using digital components.

9. The current mode power supply of claim 8, wherein the digital components comprise digital line selectors, adders and scalers.

10. A method for constructing a voltage waveform representing the current flowing through the inductor of a current mode power supply, the current mode power supply comprising first and second transistors disposed in a half-bridge configuration between an input voltage and ground with a common terminal at a node between the first and second transistors, the first transistor being disposed between the input voltage and the node, the second transistor being disposed between the node and ground, the first and second transistors being alternately gated on and off by appropriate drive signals to generate a square wave voltage output which is filtered and supplied as an output voltage to a load, wherein the method comprising sampling the voltage across the second transistor and using the sampled voltage, together with the output voltage, to construct a voltage waveform representing the dc current level and the ripple current supplied to the load without employing a sense resistor in the path of the current.

11. A method for constructing a voltage waveform representing current flowing to a load from a power supply, the power supply comprising a transistor for switching a voltage for controlling the flow of current to be supplied to a load, wherein the method comprising sampling the voltage across the transistor and using the sampled voltage, together with the output voltage, to construct a voltage waveform representing the dc current level and the ripple current supplied to the load without employing a sense resistor in the path of the current.

12. The method of claim 10, wherein the voltage across the second transistor is sensed by a switching power supply dc load information converter connected across the second transistor, and the ripple current delivered to the load is synthesized by a ripple current synthesizer connected to the input and output voltages.

13. The method of claim 12, wherein the voltage across the second transistor is sensed during a first sample period.

14. The method of claim 13, wherein a voltage corresponding to the ripple current supplied to the load is stored in a capacitor, and, during a second sample period, the capacitor voltage is updated with the voltage across the second transistor which was sensed during the first sample period.

15. The method of claim 14, wherein the capacitor is charged during a third time period in accordance with the difference between the input voltage and the output voltage.

16. The method of claim 14, wherein the voltage across the second transistor, the input voltage and the output voltage are converted from analog to digital format, and wherein the voltage waveform representing the dc current level and the ripple current supplied to the load is created using digital components.

17. The method of claim 16, wherein the digital components comprise digital line selectors, adders and scalers.

18. The current mode power supply of claim 2, wherein said transistor is part of a boost converter power supply, a flyback converter or a forward converter circuit.

19. The method of claim 11, wherein said transistor is part of a boost converter power supply, a flyback converter or a forward converter circuit.

* * * * *